United States Patent
Singh et al.

(10) Patent No.: US 6,191,046 B1
(45) Date of Patent: Feb. 20, 2001

(54) DEPOSITION OF AN OXIDE LAYER TO FACILITATE PHOTORESIST REWORK ON POLYGATE LAYER

(75) Inventors: Bhanwar Singh, Morgan Hill; Sanjay K. Yedur; Bharath Rangarajan, both of Santa Clara, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/266,362

(22) Filed: Mar. 11, 1999

(51) Int. Cl.[7] .................... H01L 21/302; H01L 21/461
(52) U.S. Cl. ..................... 438/723; 438/724; 438/725
(58) Field of Search ............................ 438/592, 593, 438/723, 724, 725; 430/938, 312

(56) References Cited

U.S. PATENT DOCUMENTS

| | | |
|---|---|---|
| 3,934,060 | 1/1976 | Burt et al. . |
| 4,255,229 | 3/1981 | Morcom . |
| 4,267,012 | 5/1981 | Pierce et al. . |
| 4,289,574 | 9/1981 | Radigan et al. . |
| 4,321,104 * | 3/1982 | Hasegawa et al. .................. 156/643 |
| 4,415,606 | 11/1983 | Cynkar et al. . |
| 4,580,332 | 4/1986 | Borodovsky . |
| 4,623,607 * | 11/1986 | Hosogai ............................. 430/312 |
| 4,672,420 | 6/1987 | Borodovsky et al. . |
| 4,778,739 | 10/1988 | Protschka . |
| 5,759,437 | 6/1998 | Datta et al. . |
| 5,807,785 | 9/1998 | Ravi . |
| 5,853,962 * | 12/1998 | Bowers ................................. 430/331 |
| 5,986,344 * | 11/1999 | Subramanion et al. ............. 257/760 |
| 6,013,574 * | 1/2000 | Hause et al. ......................... 438/622 |
| 6,103,634 * | 8/2000 | Dunton ................................ 438/724 |

FOREIGN PATENT DOCUMENTS

624660A1   11/1994   (EP) .

* cited by examiner

*Primary Examiner*—John F. Niebling
*Assistant Examiner*—Walter L. Lindsay, Jr.
(74) *Attorney, Agent, or Firm*—Renner, Otto, Boisselle & Sklar, LLP

(57) ABSTRACT

A method of reworking a photoresist used to pattern a semiconductor structure is provided. A dielectric layer is formed over an anti-reflective coating, the anti-reflective coating covering a first underlayer, the first underlayer covering a second underlayer. A first photoresist layer is formed and patterned over the dielectric layer to yield a desired photoresist pattern. An undesired feature in the patterned first photoresist layer is determined. The patterned first photoresist layer is removed. A second photoresist layer is formed and patterned over the dielectric layer. Exposed portions of the dielectric layer, the anti-reflective coating and the first underlayer are etched. A thin photoresist layer is formed over exposed portions of the second underlayer. A CMP process is performed to remove the dielectric layer. The thin photoresist layer is stripped.

19 Claims, 4 Drawing Sheets

DEPOSITION OF AN OXIDE LAYER TO FACILITATE PHOTORESIST REWORK ON POLYGATE LAYER

TECHNICAL FIELD

The present invention generally relates to lithography and more particularly relates to a method which facilitates reworking a photoresist used in integrated circuit (IC) fabrication.

BACKGROUND OF THE INVENTION

There is an ever present demand for IC fabricating fabs to increase their yield and productivity, while reducing cost. This demand has led to an ever constant attempt to rework ICs which are defective in order to salvage time and money expended in fabricating correct portions of the IC.

In general, lithography refers to processes for pattern transfer between various media. It is a technique used for integrated circuit (IC) fabrication in which, for example, a silicon wafer is coated uniformly with a radiation-sensitive film (e.g., a photoresist), and an exposing source (such as ultraviolet light, x-rays, or an electron beam) illuminates selected areas of the film surface through an intervening master template (e.g., a mask or reticle) to generate a particular pattern. The exposed pattern on the photoresist film is then developed with a solvent called a developer which makes the exposed pattern either soluble or insoluble depending on the type of photoresist (i.e., positive or negative resist). The soluble portions of the resist are then removed, leaving a photoresist mask corresponding to the desired pattern to be formed on the silicon wafer.

In the process discussed above it is important that the patterning of the photoresist yield not only the desired pattern size but a correctly aligned pattern. In some instances the patterned photoresist can be incorrectly patterned due to, for example, line-width variations such as out-of-specification line widths, mispatterning or overlay/pattern mismatch with a lower layer.

Reworking or re-patterning a photoresist of an IC device is economically desirable, as compared to scrapping the wafer, when there is at least one correctly constructed lower layer (e.g., a silicon wafer) already formed beneath a photoresist layer. However, the process of stripping the photoresist pattern layer or portion thereof may result in damage to or change a top monolayer of oxide portion of an anti-reflective coating (ARC) which lies on top of a polysilicon layer. A change in the monolayer may result in exposure dose change as well as interaction of the deep UV photoresist with the ARC material.

More particularly, a top monolayer of a silicon oxy-nitride ARC is converted into an oxide by $N_2O$ plasma to prevent nitrogen contact with the photoresist layer formed over the ARC. Nitrogen contact with the photoresist may result in undesirable footing problems (non-uniform structure). Thus, the oxide monolayer serves as a barrier between the photoresist and nitrogen portion of the ARC. Such a monolayer works fine during an intial photoresist application and photolithographic process. However, if the photoresist needs to be reworked the plasma and chemical process employed in the rework to strip the photoresist may result in removal of the oxide monolayer. Consequently, nitrogen bonds of the silicon oxy-nitride may react with a newly applied chemically amplified deep UV photoresist resulting in footing problems in the new photoresist layer.

Thus, there is a need in the art for a method which permits easy reworking of an incorrectly formed photoresist layer while preventing nitrogen contact between an ARC and newly applied photoresist layer.

SUMMARY OF THE INVENTION

The present invention relates to a method to facilitate rework of an incorrectly patterned photoresist layer. The present invention mitigates the aforementioned nitrogen contact problem by forming an oxide layer over an ARC. The oxide layer is substantially thicker than the aforementioned oxide monolayer. The oxide layer provides the same functionality (e.g., barrier to nitrogen/photoresist contact) and will withstand the harsh photoresist process such that there is sufficient oxide layer to serve as a barrier between the nitrogen of the ARC and a new second photoresist layer.

The oxide layer imparts additional advantages with respect to improving lithography. The oxide layer mitigates corner faceting of the underlayer polysilicon lines. Oftentimes, upper corners of polysilicon lines are faceted due to greater exposure to etchants as compared to bottom corners of the lines. By having the oxide layer lie atop the underlayer from which the lines are etched, the oxide layer bears the increased exposure to the etchant rather than the top corners of the lines. The dielectric layer also may serve as an additional anti-reflective coating during photolithography so as to mitigate standing wave problems that may result from a reflective underlayer.

In accordance with one aspect of the invention, a method of reworking a photoresist used to pattern a semiconductor structure is provided. A dielectric layer is formed over an anti-reflective coating. A first photoresist layer is formed and patterned over the dielectric layer to yield a desired photoresist pattern. At least one of an improper line and defect of the patterned first photoresist layer is determined. The patterned first photoresist layer is removed. A second photoresist layer is formed and patterned over the dielectric layer.

Another aspect of the present invention provides for a method of reworking a semiconductor structure containing patterned photoresist layers formed upon an oxide layer serving as a barrier between an anti-reflective coating and the photoresist layers sequentially comprising the steps of: removing the patterned photoresist layer and a portion of the underlying oxide layer from the semiconductor structure; and forming and patterning a second photoresist layer over the remaining oxide layer.

Still another aspect of the present invention relates to a method of reworking a patterned photoresist layer used in the formation of a semiconductor structure sequentially comprising the steps of: forming an oxide layer over an anti-reflective layer; forming and patterning a first photoresist layer over the oxide layer to yield a desired photoresist pattern; removing the patterned first photoresist layer and a portion of the underlying oxide layer; and forming and patterning a second photoresist layer over the remaining portion of the oxide layer.

A further aspect of the present invention relates to a semiconductor structure, including: an anti-refective coating formed over an underlayer; a dielectric layer formed over the anti-reflective coating; and a first photoresist layer formed over the dielectric layer; wherein the dielectric layer shields the first photoresist layer from the anti-reflective coating, the dielectric layer having a thickness within the range of 10 Å to 1000 Å.

Still another aspect of the present invention relates to a method of reworking a photoresist used to pattern a semiconductor structure. A dielectric layer is formed over an anti-reflective coating, the anti-reflective coating covering a first underlayer, the first underlayer covering a second underlayer. A first photoresist layer is formed and patterned over the dielectric layer to yield a desired photoresist pattern. An undesired feature in the patterned first photoresist layer is determined. The patterned first photoresist layer is removed. A second photoresist layer is formed and patterned over the dielectric layer. Exposed portions of the dielectric layer, the anti-reflective coating and the first underlayer are etched. A thin photoresist layer is formed over exposed portions of the second underlayer. A CMP process is performed to remove the dielectric layer. The thin photoresist layer is stripped.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention involves the deposition of an oxide layer in order to facilitate rework of an incorrectly patterned and/or misaligned photoresist layer.

Figure 1A:
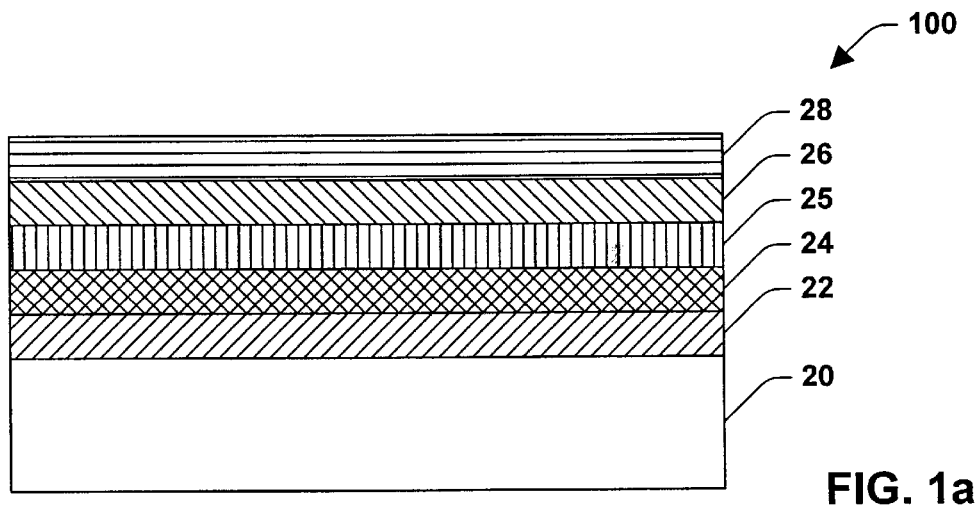
FIG. 1a is a schematic cross-sectional illustration of various layers employed in the formation of a semiconductor device prior to patterning of a photoresist layer in accordance with the present invention.

Referring initially to FIG. 1a, a gate layer 22 is formed on a silicon substrate 20 of an IC device 100 via a suitable deposition technique. Preferably, the gate oxide layer 22 is formed by depositing a suitable gate oxide material via atomic layer deposition (ALD). Although, atomic layer deposition is a preferred technique for depositing the gate oxide material, it is to be appreciated that other techniques (e.g., chemical vapor deposition (CVD)) may be employed. CVD processes include, for example, low pressure chemical vapor deposition (LPCVD) and plasma enhanced chemical vapor deposition (PECVD).

Next, a polysilicon layer 24 is deposited (preferably via atomic layer deposition (ALD)) so as to overlie the gate oxide layer 22. Although atomic layer deposition is a preferred technique for depositing the polysilicon material, it is to be appreciated that other techniques (e.g., chemical vapor deposition (CVD)) may be employed. Preferably, polysilicon layer 24 has a thickness in the range of about 500 Å to about 5000 Å.

Next, as shown in FIG. 1a the polysilicon layer 24 is covered with an anti-reflective coating layer 25 (having a thickness within the range of about 50 Å to about 1000 Å). Thereafter, an oxide layer 26 is formed over the ARC. The oxide layer 26 may be formed from any suitable oxide material. The oxide layer 26 can be composed of conventional oxide materials such as silicon oxide (SiO), silicon dioxide ($SiO_2$); borophosphosilicate glass (BPSG); borosilicate glass (BSG); fluorosilicate glass (FSG); or tetraethoxysilane (TEOS). In the present embodiment the oxide material used in the oxide layer 26 is preferably $SiO_2$. Preferably, the oxide layer 26 has a thickness within the range of 10 Å to 1000 Å.

Any suitable technique for depositing the oxide layer 26 may be employed such as LPCVD, PECVD, atmospheric pressure chemical vapor deposition (APCVD), or high density plasma chemical vapor deposition (HDPCVD) techniques such as electron cyclotron resonance (ECR), inductor coupled plasma (ICP), transformer coupled plasma (TCP) and helicon plasma. The oxide material is deposited over the ARC 25 in order to form the oxide layer 26 thereon. The oxide layer 26 forms a protective coating or seal over both the ARC 25 and the underlying polysilicon layer 24. As is further discussed below, the oxide layer 26 serves to protect the ARC 25 and the polysilicon layer 24 from the detrimental effects which may be experienced during rework of an overlying photoresist layer.

A layer of $SiO_2$ can be formed in a number of ways, for example, $SiO_2$ can be formed by CVD using $SiH_4$ and $O_2$ or $N_2O$. Alternatively, a $SiO_2$ film can be deposited via thermal chemical vapor deposition by using TEOS and ozone ($O_3$) as reactants. Such a reaction is generally conducted within a temperature range of about 200° C. to about 500° C. and a pressure of about 10 to about 200 torr. Helium gas or any other suitable carrier gas is bubbled or passed through liquid TEOS to vaporize the TEOS and supply the diluted gaseous TEOS in the carrier gas to the reaction chamber.

It should be noted that the present embodiment is not limited to the above methods for depositing a $SiO_2$ film, rather any suitable deposition method and deposition material may be used so long as the oxide layer 26 is of sufficient thickness. As noted above, preferably, the oxide layer 26 has a thickness within the range of 10 Å to 1000 Å. In another embodiment, the oxide layer 26 has a thickness from about 100 Å to about 2,000 Å. In yet another embodiment, the oxide layer 26 has a thickness from about 200 Å to about 1,500 Å. In still another embodiment, the oxide layer 26 has a thickness from about 300 Å to about 1,000 Å.

In an alternative embodiment, borosilicate glass (BSG) can be used to form oxide layer 26. For example, a BSG film can be deposited by any suitable CVD technique under any one of the following conditions:

$$SiH_4 + B_2H_6 + O_2 \text{ at } 400° \text{ C.} \quad (1)$$

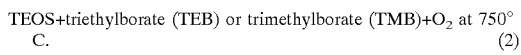

$$TEOS + \text{triethylborate (TEB) or trimethylborate (TMB)} + O_2 \text{ at } 750° \text{ C.} \quad (2)$$

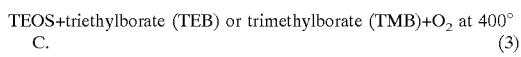

$$TEOS + \text{triethylborate (TEB) or trimethylborate (TMB)} + O_2 \text{ at } 400° \text{ C.} \quad (3)$$

Alternatively, BSG may be deposited by reacting an organometallic compound having a Si—O—B bond source with ozone ($O_3$) at a depositing temperature of about 400° C. or lower. As a source of a Si—O—B bonds, an organometallic having the general formula

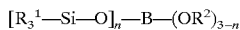

$$[R_3^1\text{—Si—O}]_n\text{—B—}(OR^2)_{3-n}$$

may be used, wherein n=1–3, $R^1$ and $R^2$ represent an alkyl group, an aryl group, or some similar organic group. For example, tris-trimethylsilyborate ($[(CH_3)_3SiO]_3B$) may be used as a source of Si—O—B bonds.

In still another embodiment, a borophosphosilicate glass (BPSG) may be used to form oxide layer 26. A BPSG may deposited by APCVD, LPCVD or PECVD using a source of silicon (e.g., silane or TEOS), oxygen (e.g, $N_2O$ or $O_2$), phosphorous (e.g., phosphene, trimethylphosphate (tmp) or triethylphosphate (tep)), and boron (e.g., diborane or triethylborate) using suitable reaction conditions.

It will be appreciated that other suitable dielectric materials may be employed as a substitute for oxide. In yet another embodiment, a fluorosilicate glass (FSG) may be used to form the dielectric layer 26. For example, a FSG may be deposited by PECVD using $SiF_4$, TEOS and $O_2$ as reactants. Alternatively, $SiF_4$, TEOS, $O_2$ or $N_2$, and $NF_3$ or $F_2$ may be used as reactants to produce an FSG film.

Next, a layer 28 of suitable positive or negative photoresist material is applied to the clean surface of the oxide layer 26 and dried. The resist layer may be any suitable standard resist material and may be positive acting or negative acting. The resists may be sensitive to E-line, G-line, H-line, I-line, near, mid, and deep UV, electron beam, x-ray, ion beam or laser radiation. The resist layer may be applied by any suitable process such as, for example, spin coating from solution, followed by drying. In one embodiment, the thickness of the dried resist may range from about 0.25 μm to about 10 μm.

A circuit image of any desired pattern is next formed within the resist layer by exposure of the resist layer to radiation through an appropriate photolithographic mask or by controlled laser, ion beam or electron beam energy sources, followed by suitable development to remove the exposed or unexposed areas of the resist, depending on the resist chemistry. The development step exposes that portion of the oxide layer 26, the ARC 25 and the polysilicon layer 24 which are to be etched away during later processing stages, while the remaining portions of the surface 26 continue to be masked by the resist. Positive resist materials (e.g., novolac resin types) are preferred for this invention since they may be developed using aqueous alkaline developer materials such as alkali or alkaline earth metal hydroxide or metal-silicate aqueous solutions (e.g., 0.2 N KOH).

Thereafter, the photoresist layer 28 is checked to ascertain whether or not the photoresist layer 28 is correctly formed. Checking of the photoresist layer can include, for example, determination of whether or not the width of the lines contained within the patterned photoresist are within an allowable range, determination of whether the patterned photoresist is correctly aligned with, for example, underlying layers or determination that the correct pattern was in fact imparted to the photoresist layer 28. If it is determined that the photoresist layer 28 has been correctly patterned then IC device 100 is permitted to continue on in the processing cycle. However, if it is determined IC device 100 contains an incorrectly patterned photoresist layer 28b (FIG. 1b) then IC device 100 is designated for rework.

Figure 1B:
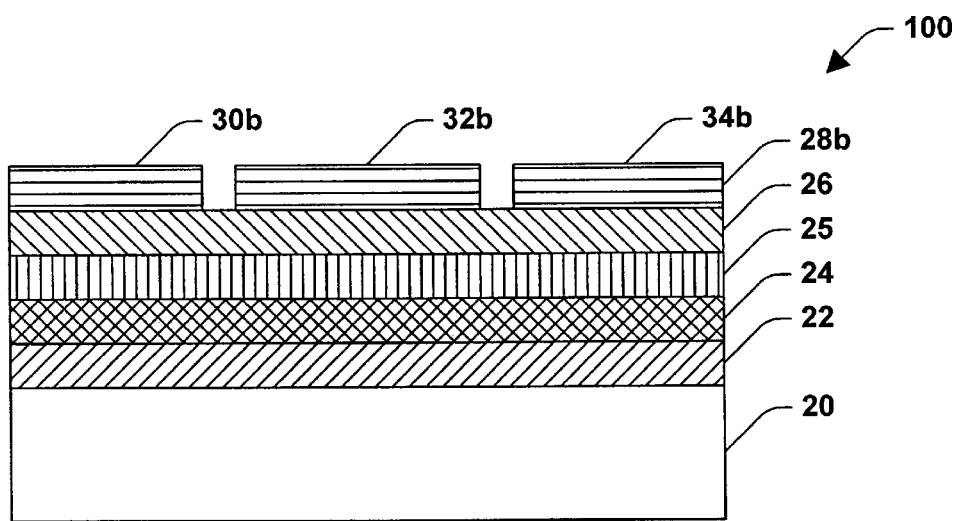
FIG. 1b is a schematic perspective illustration of the semiconductor structure of FIG. 1a after patterning of the photoresist layer and illustrating one type of incorrectly patterned photoresist layer in accordance with the present invention.

As is shown in FIG. 1b, incorrectly patterned photoresist layer 28b is represented by photoresist pattern lines 30b, 32b and 34b. The photoresist pattern lines 30b, 32b and 34b are incorrect due to incorrect or out-of-specification line-widths.

Reworking or re-patterning essentially entails the removal (whether partial or full) of the incorrectly formed or defective photoresist layer, redeposition and re-patterning of a new (second) photoresist layer so as to either complete or permit completion of the reworked IC. Preferably, for convenience, the entire defective or incorrectly formed layer is completely removed during rework. This permits faster rework times by eliminating the need for having to selectively rework only the defective or incorrect portion of a layer. As used throughout the specification, an incorrectly formed photoresist layer 28b denotes a photoresist layer which is either partially or completely defective or partially or completely improperly formed, as explained above, due to at least one non-conformity with expected patterning.

Figure 1C:
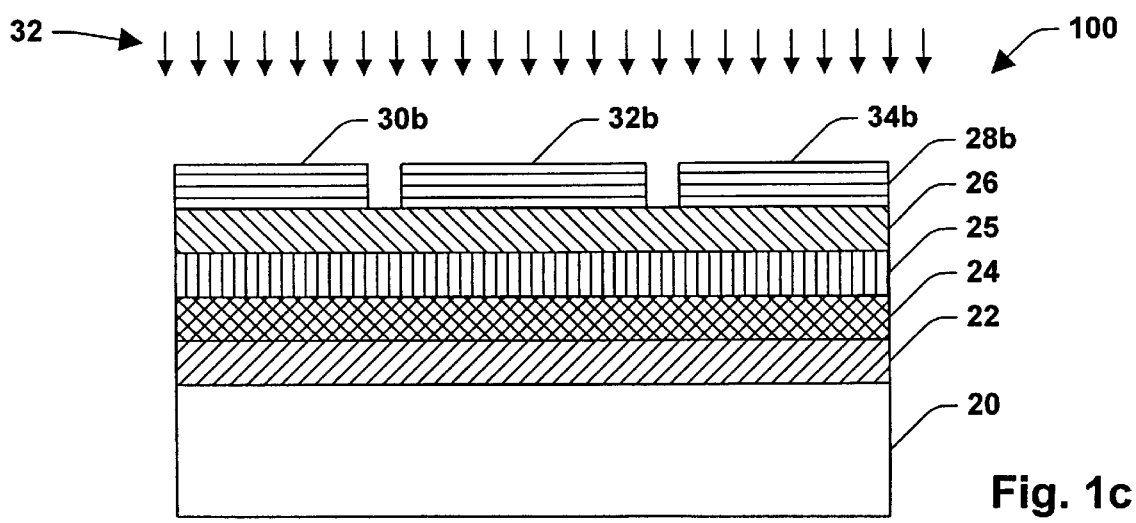
FIG. 1c is a schematic cross-sectional illustration of the semiconductor structure of FIG. 1b undergoing removal of the incorrectly patterned photoresist layer in accordance with the present invention.

The processes available for reworking an IC depend in large part upon the composition of the incorrectly patterned or defective layer which is to be removed. For example, if photoresist layer 28 is composed of a novolac resin type photoresist material, a defective or incorrectly patterned photoresist layer 28b can be removed by ACT-935, followed by washing with water and then a plasma strip to completely remove the defective or incorrectly photoresist layer 28b. As can be seen in FIG. 1c, the removal portion of the reworking process is graphically illustrated by arrows 32.

As discussed above, during rework a conventional oxide monolayer of an ARC would also be stripped or partially stripped during rework thus exposing portions of the silicon oxy-nitride ARC to a photoresist to be newly applied. The nitrogen of the ARC may creating undesirable footing problems in the new photoresist. The present invention mitigates such problems by employment of the oxide layer 26 formed in the manner discussed above. The oxide layer 26 acts as a protective layer to serve as a barrier to nitrogen contamination of the photoresist 28 by the ARC 25. The oxide layer 26 has a thickness which affords for sufficient oxide layer 26 to remain after a photoresist stripping process such that the remaining oxide layer 26 still prevents nitrogen contamination of the newly applied photoresist layer. As a result an increase in production yield is realized due to the ability of IC devices with incorrectly patterned photoresists to be reworked.

Figure 1D:
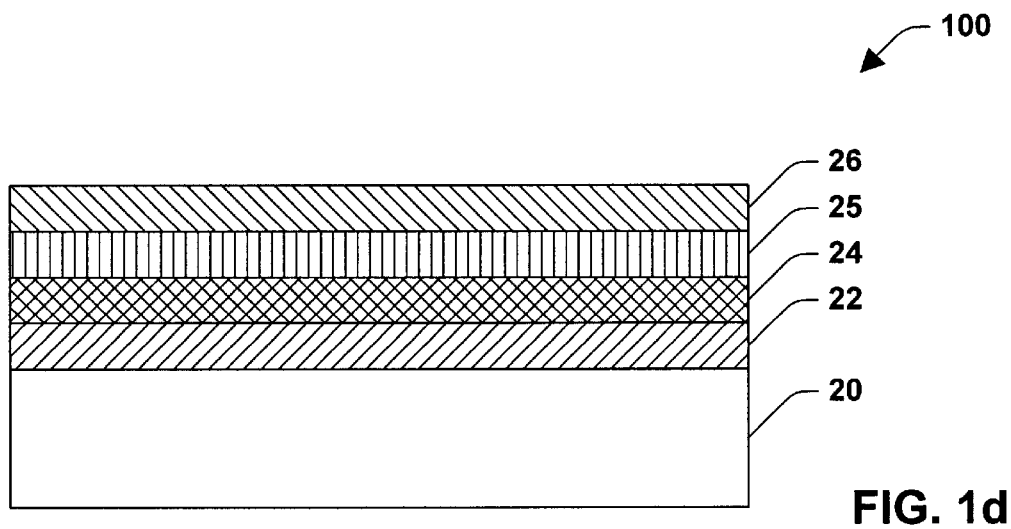
FIG. 1d is a schematic cross-sectional illustration of the semiconductor structure of FIG. 1b after the removal of the incorrectly patterned photoresist layer.
Figure 1E:
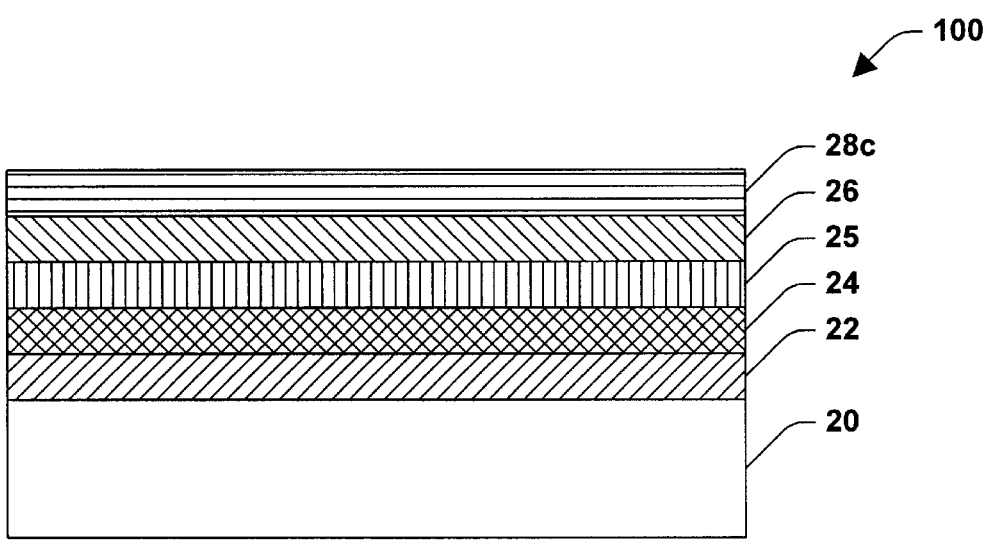
FIG. 1e is a schematic cross-sectional illustration of the semiconductor structure of FIG. 1d after formation of a second photoresist layer.

After the removal portion of the rework process is completed, as shown in FIG. 1d, another photoresist layer 28c is deposited so as to overlie the oxide layer 25 so as to yield the structure shown in FIG. 1e. The new (second) photoresist layer 28c may be composed of an identical or different material than the first photoresist layer 28.

Figure 1F:
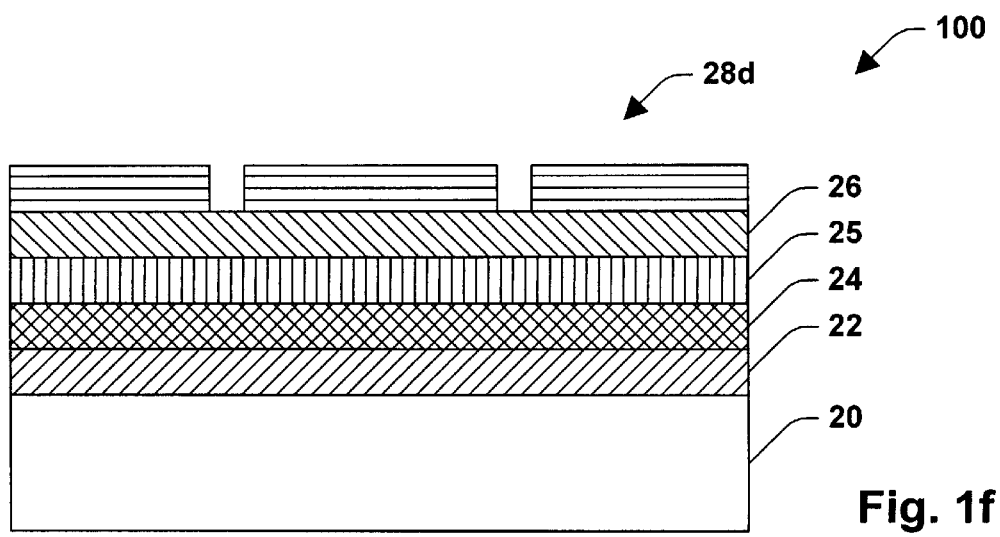
FIG. 1f is a schematic cross-sectional illustration of the semiconductor structure of FIG. 1e after correct patterning of the second photoresist layer.

Preferably, the new photoresist layer 28c is composed of and deposited in the same manner as the first photoresist layer 28. The new photoresist layer 28c is then patterned, as discussed above, so as to yield a correctly patterned photoresist layer 28d (FIG. 1f). FIGS. 1g–1j illustrate steps involved to remove the oxide layer 26.

Figure 1G:
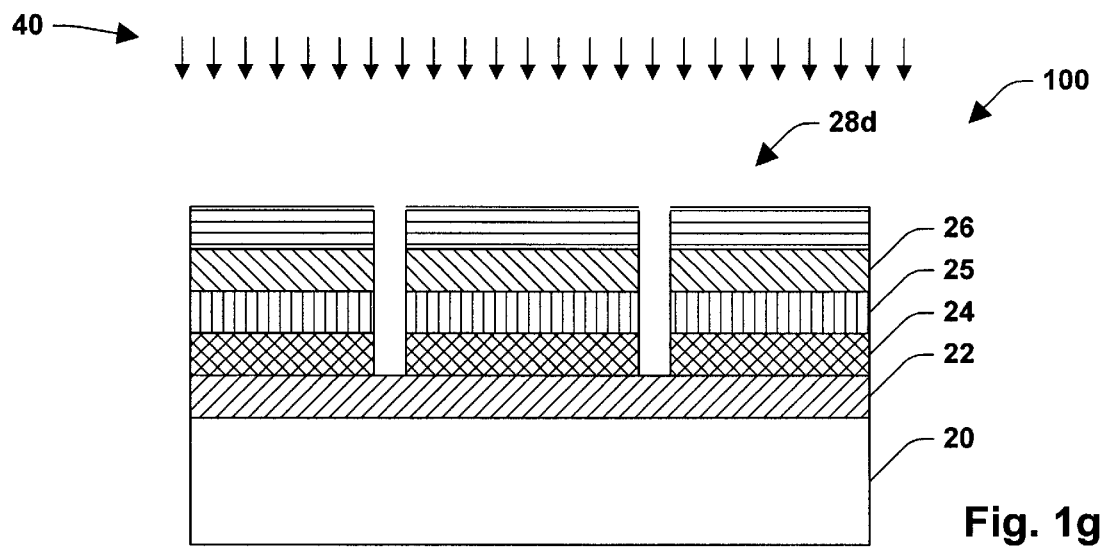
FIG. 1g is a schematic cross-sectional illustration of the semiconductor structure of FIG. 1f after etching exposed portions of the oxide layer, anti-reflective layer and polysilicon layer.
Figure 1H:
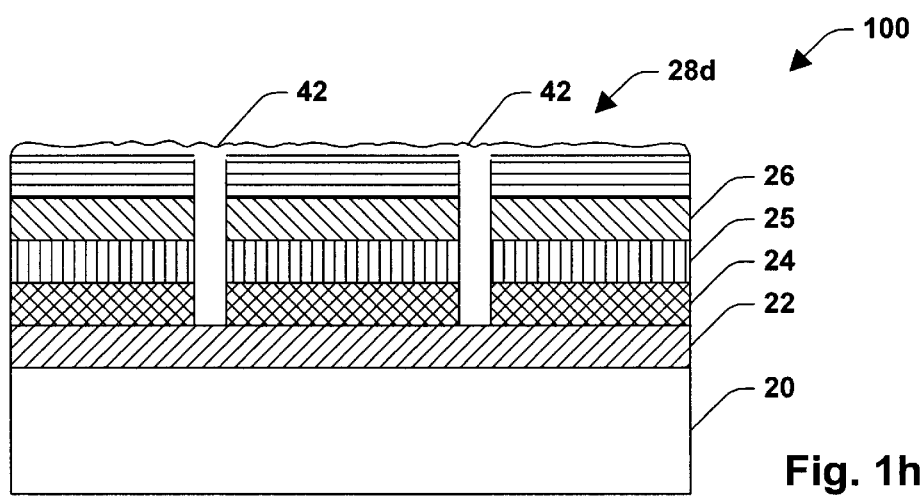
FIG. 1h is a schematic cross-sectional illustration of the semiconductor structure of FIG. 1g after applying a thin photoresist layer to shield exposed portions of the gate oxide layer.
Figure 1I:
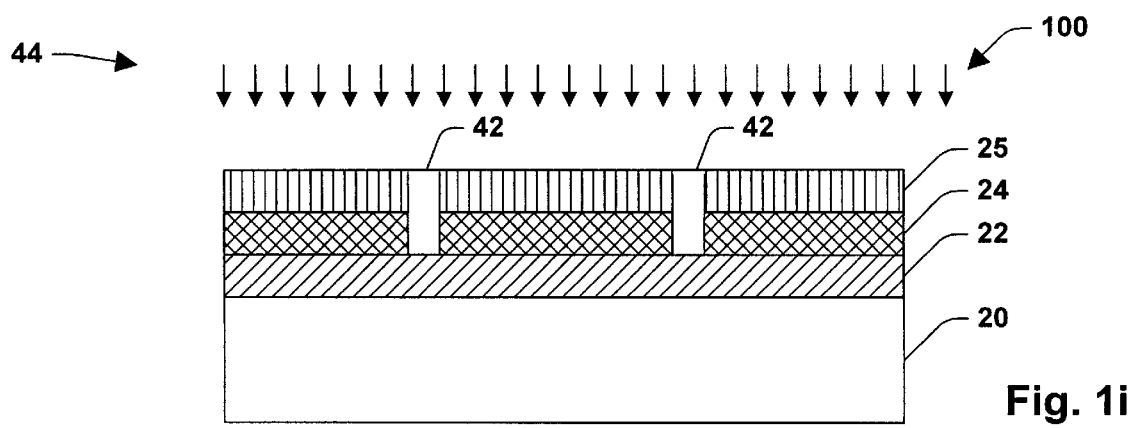
FIG. 1i is a schematic cross-sectional illustration of the semiconductor structure of FIG. 1h after performing a CMP step to remove the oxide layer 26.
Figure 1J:
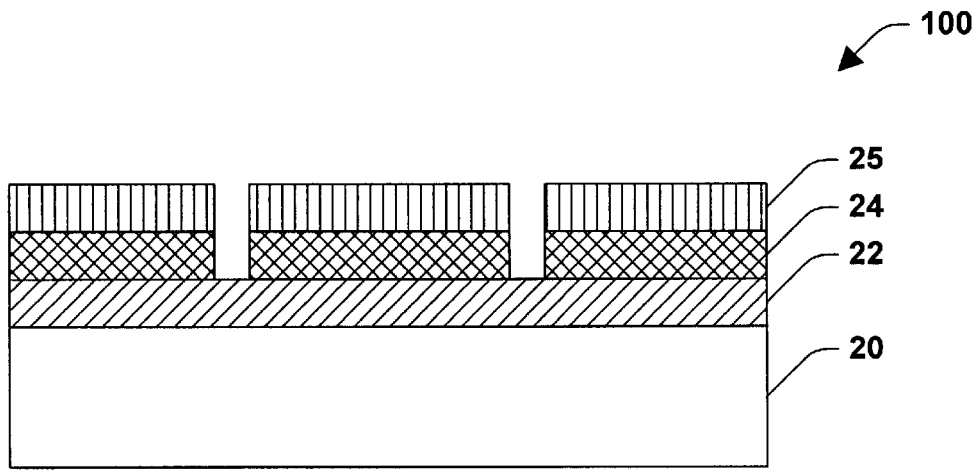
FIG. 1j is a schematic cross-sectional illustration of the semiconductor structure of FIG. 1i after stripping the thin photoresist layer.

In FIG. 1g an etching step 40 is performed to etch exposed portions of the oxide layer 26, anti-reflective layer 25 and polysilicon layer 24. Any suitable etch chemistry may be employed to carry out the etch step 40. Next, in FIG. 1h a thin photoresist layer 42 is applied to shield exposed portions of the gate oxide layer from a CMP process 44 (FIG. 1i) to remove the oxide layer 26. After the CMP process 44, thin photoresist layer 42 is stripped as shown in FIG. 1j to complete the steps for oxide layer 25 removal.

Figure 2:
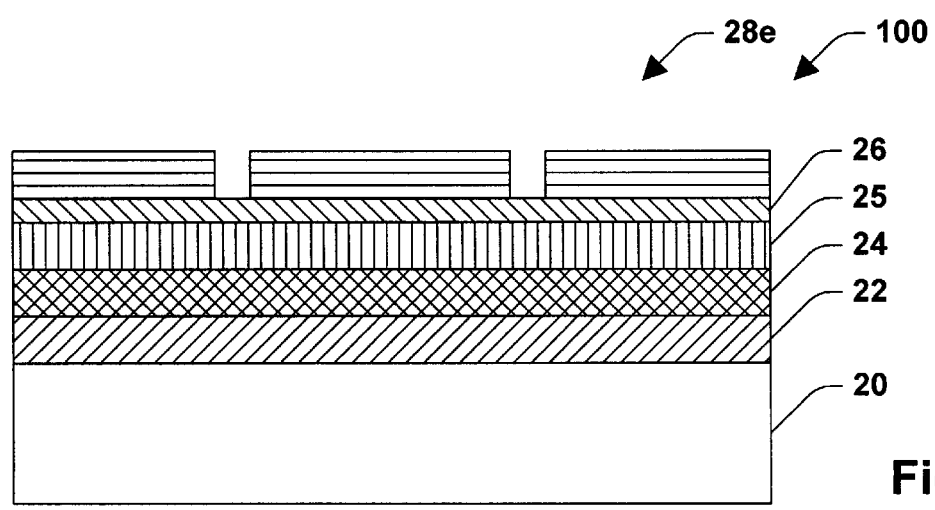
FIG. 2 is a schematic cross-sectional illustration of a semiconductor structure in accordance with another embodiment of the present invention.

In yet another embodiment, during the removal of the defective or incorrectly formed photoresist layer 28b a portion of the underlying oxide layer 26 is also removed (FIG. 2). This is advantageous in that the removal of a portion of the oxide layer 26 permits the formation of a low defect device upon which to deposit and correctly pattern a new photoresist layer 28e. Preferably, the portion of the oxide layer 26 which is removed during rework has a thickness of about 0.50 Å to about 6 Å. In yet another embodiment, the portion of the oxide layer 26 which is removed during rework has a thickness of about 0.75 Å to about 4.5 Å. In still another embodiment, the portion of the oxide layer 26 which is removed during rework has a thickness of about 1 Å to about 3 Å. It is to be appreciated that oxide layer removal steps as described above with respect to FIGS. 1g–1j are also performed in connection with this embodiment.

Thus, the employment of the oxide layer 26 serves to mitigate nitrogen contamination of the newly applied photoresist layer 28e. Furthermore, it is to be appreciated that during patterning of the photoresist, the oxide layer 26 may serve as an additional anti-reflective coating and thus mitigate standing wave problems. The oxide layer 26 may also mitigating of structures formed from the polysilicon layer 24 due to chemical exposure.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of reworking a photoresist used to pattern a semiconductor structure comprising the steps of:
   forming a dielectric layer over an anti-reflective coating;
   forming and patterning a first photoresist layer over the dielectric layer to yield a desired photoresist pattern;
   identifying at least one of an improper line size and defect in the patterned first photoresist layer;
   removing the patterned first photoresist layer; and
   forming and patterning a second photoresist layer over the dielectric layer.

2. The method of claim 1 further including the step of employing at least one of SiO and $SiO_2$ as the dielectric layer.

3. The method of claim 1 further including the step of employing borosilicate glass as the dielectric layer.

4. The method of claim 1 further including the step of employing fluorosilicate glass as the dielectric layer.

5. The method of claim 1 further including the step of forming at least one of the first and second photoresist layers to have a thickness within the range of about 0.25 µm to 10 µm.

6. The method of claim 1 further including the step of forming the dielectric layer to have a thickness within the range of 10 Å to 1000 Å.

7. A method of reworking a semiconductor structure containing a patterned photoresist layers formed upon an oxide layer serving as a barrier between an anti-reflective coating and the photoresist layers sequentially comprising the steps of:
   removing the patterned photoresist layer and a portion of the underlying oxide layer from the semiconductor structure; and
   forming and patterning a second photoresist layer over the remaining oxide layer.

8. The method of claim 7, wherein the portion of the oxide layer that is removed along with the defectively patterned photoresist layer has a thickness of from about 0.50 to about 6 Å.

9. The method of claim 7, wherein the step of removing the patterned photoresist layer and a portion of the oxide layer is accomplished by sequentially using ACT-935, water and plasma stripping.

10. The method of claim 7, wherein the oxide layer is deposited by at least one of: low-pressure chemical deposition, plasma enhanced chemical deposition, atmospheric pressure chemical deposition, or high density plasma chemical vapor deposition.

11. The method of claim 7, wherein the step of forming and patterning the second photoresist layer over the remaining portion of the oxide layer is accomplished by depositing a photoresist material by spin coating from solution, followed by drying.

12. The method of claim 7, wherein the oxide layer comprises silicon dioxide.

13. The method of claim 12, wherein silicon dioxide is formed from $SiH_4$ and $O_2$ or $N_2O$.

14. A method of reworking a patterned photoresist layer used in the formation of a semiconductor structure sequentially comprising the steps of:
   forming an oxide layer over an anti-reflective layer;
   forming and patterning a first photoresist layer over the oxide layer to yield a desired photoresist pattern;
   removing the patterned first photoresist layer and a portion of the underlying oxide layer; and
   forming and patterning a second photoresist layer over the remaining portion of the oxide layer.

15. The method of claim 14 further including the step of employing at least one of SiO and $SiO_2$ as the dielectric layer.

16. The method of claim 14 further including the step of employing borosilicate glass as the dielectric layer.

17. The method of claim 14 further including the step of employing fluorosilicate glass as the dielectric layer.

18. The method of claim 14 further including the step of forming at least one of the first and second photoresist layers to have a thickness within the range of about 0.25 µm to 10 µm.

19. A method of reworking a photoresist used to pattern a semiconductor structure comprising the steps of:

forming a dielectric layer over an anti-reflective coating, the anti-reflective coating covering a first underlayer, the first underlayer covering a second underlayer;

forming and patterning a first photoresist layer over the dielectric layer to yield a desired photoresist pattern;

identifying an undesired feature in the patterned first photoresist layer;

removing the patterned first photoresist layer;

forming and patterning a second photoresist layer over the dielectric layer;

etching exposed portions of the dielectric layer, the anti-reflective coating and the first underlayer;

forming a thin photoresist layer over exposed portions of the second underlayer;

performing a CMP process to remove the dielectric layer; and stripping the thin photoresist layer.

* * * * *